(12) United States Patent
Kim et al.

(10) Patent No.: US 10,347,621 B2
(45) Date of Patent: Jul. 9, 2019

(54) ELECTROSTATIC DISCHARGE GUARD RING WITH SNAPBACK PROTECTION

(71) Applicant: Texas Instruments Incorporated, Dallas, TX (US)

(72) Inventors: Sunglyong Kim, Allen, TX (US); David LaFonteese, Redwood City, CA (US); Seetharaman Sridhar, Richardson, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 324 days.

(21) Appl. No.: 15/291,564

(22) Filed: Oct. 12, 2016

(65) Prior Publication Data

US 2018/0102357 A1    Apr. 12, 2018

(51) Int. Cl.
*H01L 27/02* (2006.01)
*H01L 29/78* (2006.01)
*H01L 29/10* (2006.01)
*H01L 29/06* (2006.01)

(52) U.S. Cl.
CPC ...... *H01L 27/0259* (2013.01); *H01L 29/0619* (2013.01); *H01L 29/1095* (2013.01); *H01L 29/7818* (2013.01)

(58) Field of Classification Search
CPC ............. H01L 27/0259; H01L 29/0619; H01L 29/7818; H01L 27/0248; H01L 27/0266; H01L 27/0255; H01L 29/1095
See application file for complete search history.

(56) References Cited

U.S. PATENT DOCUMENTS

2008/0191277 A1\* 8/2008 Disney ................ H01L 29/0638
257/343

\* cited by examiner

*Primary Examiner* — William F Kraig
*Assistant Examiner* — Khatib A Rahman
(74) *Attorney, Agent, or Firm* — Tuenlap Chan; Charles A. Brill; Frank D. Cimino

(57) ABSTRACT

An electrostatic discharge (ESD) protection structure that provides snapback protections to one or more high voltage circuit components. The ESD protection structure can be integrated along a peripheral region of a high voltage circuit, such as a high side gate driver of a driver circuit. The ESD protection structure includes a bipolar transistor structure interfacing with a PN junction of a high voltage device, which is configured to discharge the ESD current during an ESD event. The bipolar transistor structure has a collector region overlapping the PN junction, a base region embedded with sufficient pinch resistance to launch the snapback protection, and an emitter region for discharging the ESD current.

18 Claims, 6 Drawing Sheets

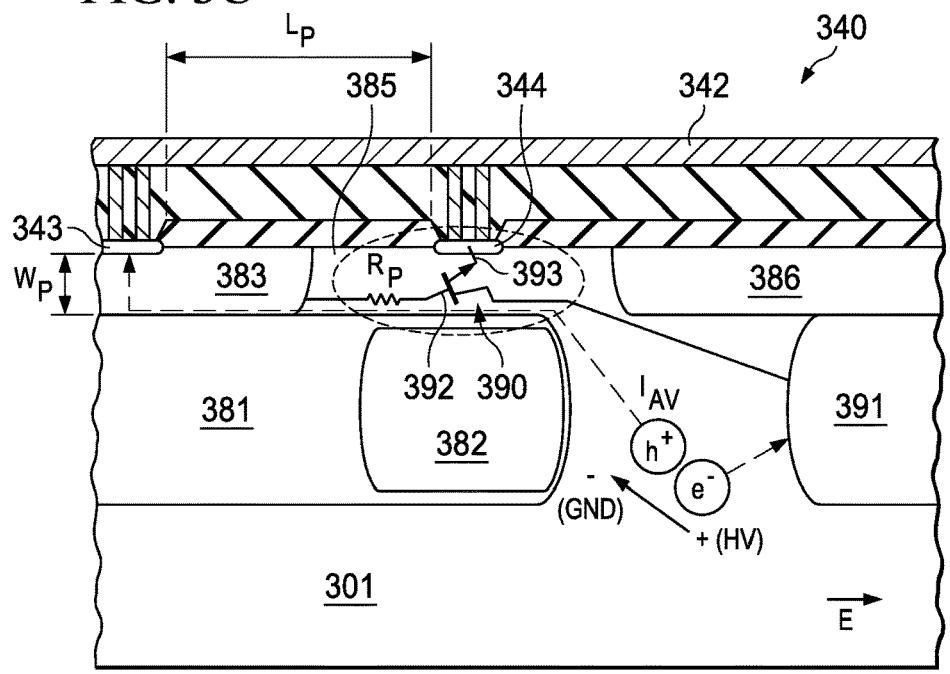
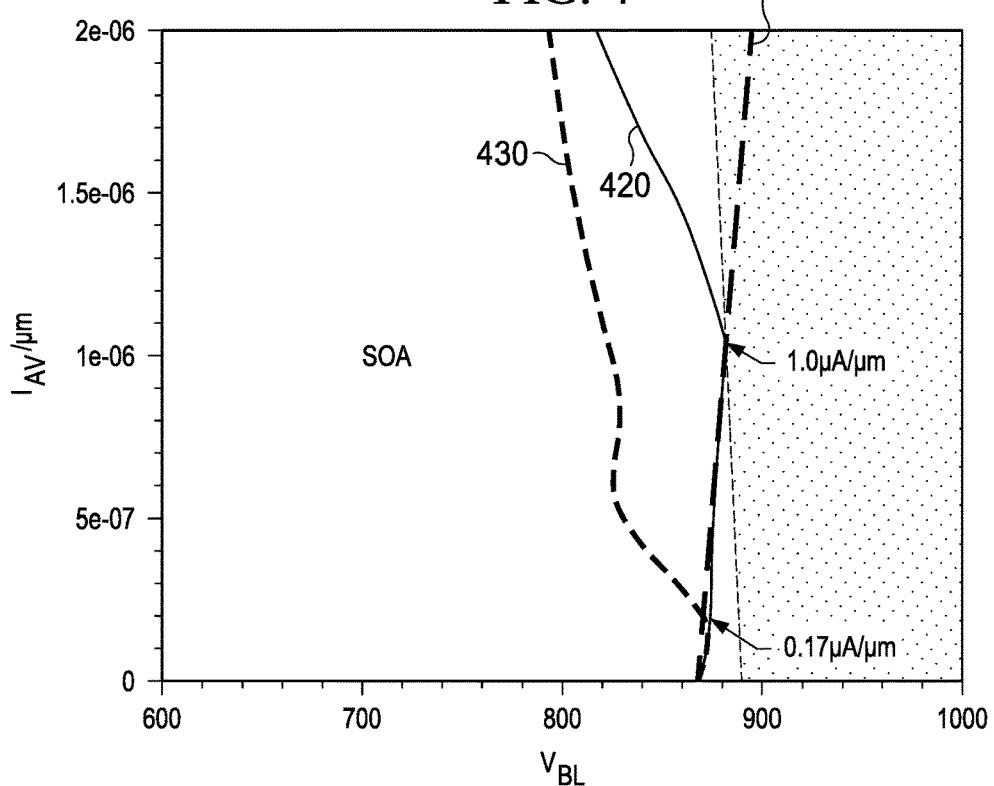

ELECTROSTATIC DISCHARGE GUARD RING WITH SNAPBACK PROTECTION

BACKGROUND

Motorized machines include driver circuits for controlling the operations of one or more motors. Each of these driver circuits may include a high side gate driver and a low side gate driver. The high side gate driver is configured to convert low voltage input signals (e.g., less than 15V) to high voltage signals for delivery at the gate of a high side switch where voltage may swing from 0V to 600V. The low side gate driver is configured to deliver low voltage input signals to the gate of a low side switch (e.g., less than 15V). These high voltage signals and low voltage signals are delivered to a motorized load for controlling one or more motor operations.

During an electrostatic discharge (ESD) event, the high side gate driver may receive a large amount of current in a short period of time. If the ESD current is not properly dissipated, it may create a large amount of voltage build-up within the high side gate driver. This high voltage build-up may cause damages to the high side gate driver, and it may potentially be hazardous to human operators who operate the motorized machines. To prevent high ESD voltage from building up within the high side gate driver, several ESD protection devices may be deployed. However, these ESD protection devices are typically large in size and may be area inefficient where the driver circuits have significant area constrains.

SUMMARY

The present disclosure describes systems and techniques relating to the manufacturing of an electrostatic discharge (ESD) protection structure that provides snapback protections to one or more high voltage circuit components. The disclosed ESD protection structure is size efficient as it may be integrated along a peripheral region of a high voltage circuit, such as a high side gate driver of a driver circuit. The disclosed ESD protection structure includes a bipolar transistor structure interfacing with a PN junction of a high voltage device, which is configured to discharge the ESD current during an ESD event. The bipolar transistor structure has a collector region near the PN junction, a base region embedded with sufficient pinch resistance to launch the snapback protection, and an emitter region for discharging the ESD current. Advantageously, the disclosed ESD protection structure may protect against ESD events characterized by high voltages (e.g., 1 kV or above) and high current density (e.g., 1 µA/µm) without imposing significant area penalty on an integrated circuit die.

In one implementation, for example, the present disclosure introduces an integrated circuit having a semiconductor substrate, a buried layer, and a peripheral structure. The semiconductor substrate has a first conductivity type and a top surface defining a circuit region and a peripheral region that laterally surrounds the circuit region. The buried layer is formed under the top surface of the semiconductor substrate. The buried layer is positioned within the circuit region and adjacent to the peripheral region. The buried layer having a second conductivity type opposite to the first conductivity type. The peripheral structure is positioned within the peripheral region and adjacent to the top surface. The peripheral structure includes a first contact region having the first conductivity type, and a second contact region having the second conductivity type. The second contact region is interposed between the buried layer and the first contact region.

In another implementation, for example, the present disclosure introduces an integrated circuit having a semiconductor substrate, a diode, a lateral drain metal oxide semiconductor (LDMOS) transistor, and a peripheral structure. The semiconductor substrate has a P-type dopant and a top surface defining a circuit region and a peripheral region that laterally surrounds the circuit region. The diode has a cathode region that is positioned within the circuit region and adjacent to the peripheral region. The cathode region includes an N-type dopant. The LDMOS transistor is positioned within the circuit region and adjacent to the peripheral region, the LDMOS transistor having a lateral drain region separated from the cathode region. The lateral drain region includes the N-type dopant as well. The peripheral structure is positioned within the peripheral region and adjacent to the top surface. The peripheral structure including a first contact region having the P-type dopant, and a second contact region having the N-type dopant. The second contact region is interposed between the first contact region and the cathode region, and it is also interposed between the first contact region and the lateral drain region.

DRAWING DESCRIPTIONS

FIGS. 3A-3C show cross-sectional views of the peripheral structures according to an aspect of the present disclosure.

FIG. 4 shows a current-voltage (IV) diagram illustrating the snapback currents conducted by the peripheral structure according to an aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
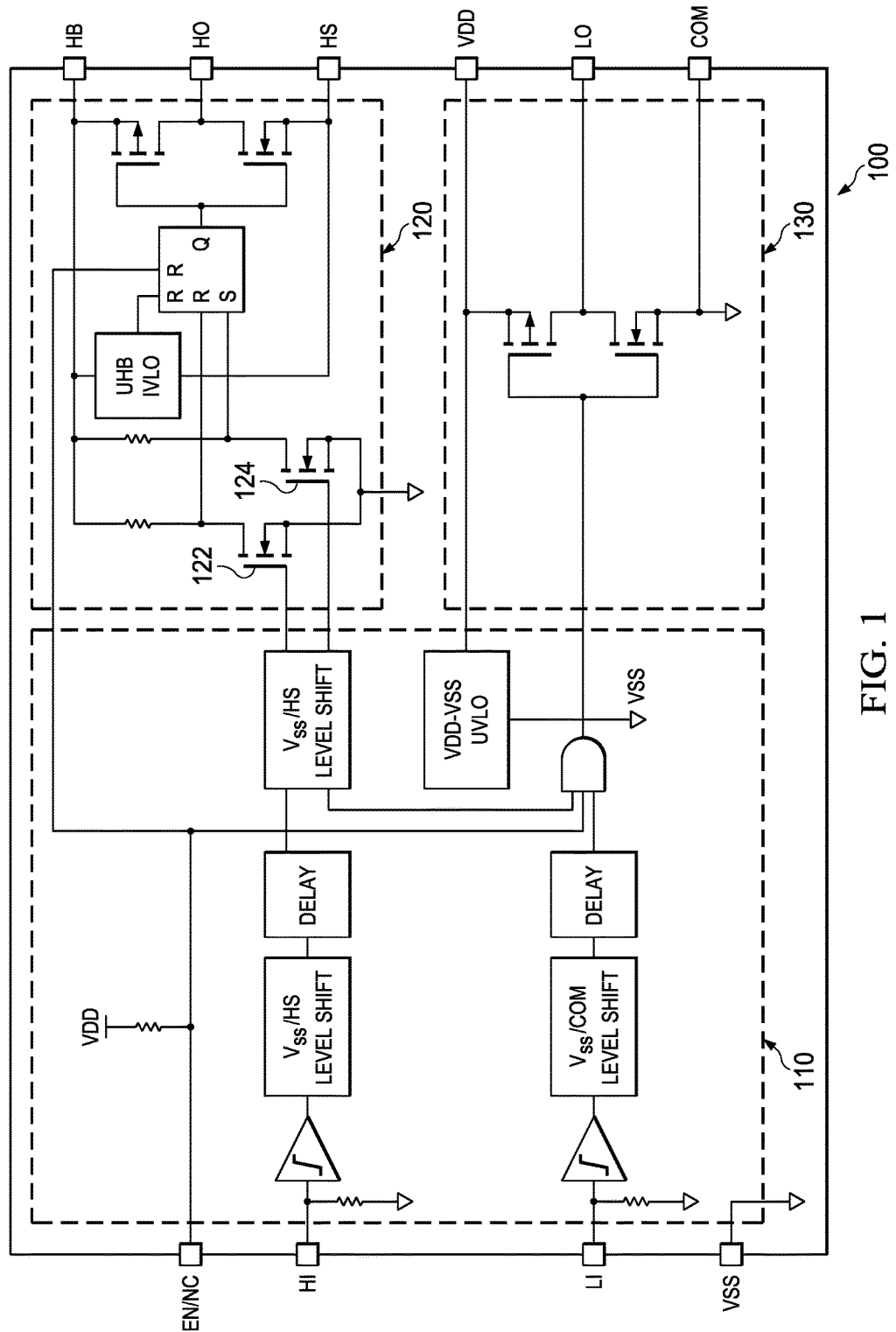
FIG. 1 shows a schematic view of a driver integrated circuit according to an aspect of the present disclosure.

FIG. 1 shows a schematic view of a driver integrated circuit 100 according to an aspect of the present disclosure. The driver integrated circuit 100 includes a low voltage control circuit (LVC) 110, a high side gate driver circuit (HSGD) 120, and a low side gate driver circuit (LSGD) 130. In general, the driver integrated circuit 100 serves as an interface between a backend system (not shown) and a motorized load (not shown). The backend system is configured to generate one or more control signals for driving the motorized load. The driver integrated circuit 100 is configured to process and level-shift the control signals for delivery to the motorized load. Moreover, the driver integrated circuit 100 protects the backend system from high voltages and surge currents generated by the motorized load.

The LVC 110 interfaces with the backend system using the EN/NC pad, the HI pad, the LI pad, and the VSS pad. The EN/NC pad is configured to receive an Enable signal from the backend system. The Enable signal is configured to indicate whether the driver integrated circuit 100 can be operated without the EN pin connection. If the EN pin is connected, it can be either enabled or disabled for operation. The HI pad is configured to receive a high side input signal from the backend system. The high side input signal is configured to drive the HO pin to a high voltage if it has a high state, and it is configured to drive the HO pin to a low voltage (e.g., 0V) if it has a low state. The LI pad is configured to receive a low side input signal from the backend system. Similar to the high side input signal, the low side input signal is configured to drive low side switch by controlling LO output. The VSS pad is configured to receive a ground supply voltage (VSS) from the backend system or from an external voltage source.

The LSGD 130 interfaces with the backend system using the VDD pad and the COM pad. The VDD pad is configured to receive a regulated voltage (VDD) from the backend system or an external low voltage source (e.g., 15V or lower). The COM pad is configured to receive a common signal from the backend system. The common signal is configured to receive a ground supply voltage in certain applications. The LSGD 130 also interfaces with the motorized load using the LO pad. In particular, the LO pad is configured to deliver a low side output signal to a low side gate device in the motorized load. The low side output signal is generated based on the control signal received by the LI pad.

The HSGD 120 interfaces with the motorized load using the HO pad, which is configured to deliver a signal that may swing from 0V to approximately 700V. In particular, the HO pad is configured to deliver a high side output signal to a high side gate device in the motorized load. The high side output signal is generated based on the control signal received by the LO pad. The HSGD 120 includes a first lateral drain metal oxide semiconductor (LDMOS) transistor 122 and a second LDMOS transistor 124. Collectively, the first and second LDMOS transistors 122 and 124 are configured to convert a low voltage input signal (e.g., 15V or less) from the HI pad to generate a high voltage (e.g., approximately 700V) output signal delivered by the HO pad. The HB pad serves similar functions as the VDD pad in the LGSD 130, whereas the HS pad serves similar functions as the COM pad in the LGSD 130. In general, the potential difference between the HB pad and the HS pad is substantially equal to the potential difference between the VDD pad and the COM pad. Unlike the COM pad, which is typically coupled to a Ground (e.g., 0V) supply source, the HS pad is configured to float from 0V to 700V.

The HSGD 120 is isolated to protect the LVC 110 and the LSGD 130 from high voltage operations and from electrostatic discharge (ESD) events associated with the high voltage pads HB, HO, and HS. While ESD events may be introduced by all pins, including pins in the LVC 110, the ESD protection among the pins in the LVC 110 is a lesser concern where separate ESD device can be used without a substantial size penalty. By contrast, protecting the LVC 110 from the ESD events of the LSGD 130 may call for a much larger ESD device.

During an ESD event, an ESD voltage (e.g., 1 kV to 2 kV) may be established between one or more of the high voltage pads HB, HO, and HS on the one hand, and the COM pad on the other hand. To alleviate the ESD voltage, the LDMOS transistor 122 and 124 are triggered to deliver an ESD current in the range of 1 A. Due to overheating as a result of high current density, the LDMOS transistors 122 and 124 may be damaged when the ESD voltage is above a certain threshold (e.g., 1.4 kV) under the Human-Body Model (HBM) ESD standard.

To reduce the current density of the ESD current, the LDMOS transistors 122 and 124 may be widened with larger gate width. Such an approach however, may impose significant area penalty on the overall die size of the driver integrated circuit 100. For example, the gate width of each LDMOS transistors 122 and 124 may be seven times larger in order to sustain a 1.4 kV HBM ESD voltage threshold. The enlarged gates also demand additional gate pull up circuits, which will further increase the die size.

To overcome these issues, the present disclosure introduces an ESD protection structure that can sustain the flow of a high ESD current and meet the HBM ESD standard without incurring significant die area penalty. The disclosed ESD protection structure provides snapback protections to one or more PN junctions of high voltage circuit components, such as the LDMOS transistors 122 and 124. Advantageously, the disclosed ESD protection structure is size efficient as it may be integrated along a peripheral region of a high voltage circuit, such as the HSGD 120.

Figure 2:
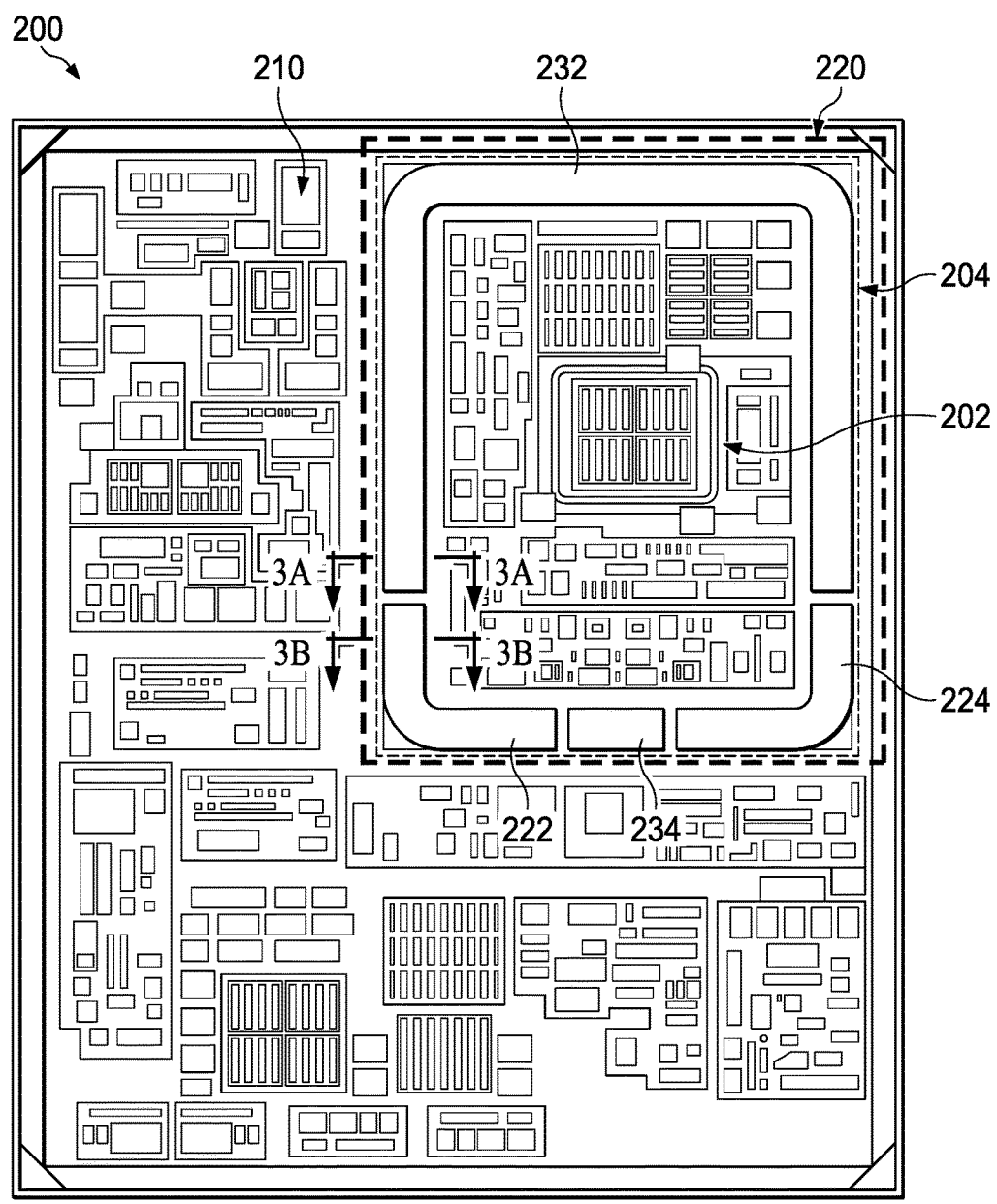
FIG. 2 shows a top exposed view of a driver integrated circuit according to an aspect of the present disclosure.

As shown in FIG. 2, for example, a layout of a driver integrated circuit 200 incorporates a version of the disclosed ESD structure for implementing the driver integrated circuit 100. The driver integrated circuit 200 includes a high voltage region 220 and a low voltage region 210. The high voltage region 220 includes the layout of the HSGD 120, whereas the low voltage region 210 includes the layout of the LSGD 130 and the LVC 110. In general, the high voltage region 220 is isolated from the low voltage region 210 to protect the low voltage region 210 (e.g., 15V or below) from high voltage operations (e.g., up to about 700V).

The high voltage region 220 includes a circuit region 202 and a peripheral region 204. The circuit region 202 includes circuit components of the HSGD 120, such as the LDMOS transistors 122 and 124. In one implementation, for example, the LDMOS transistors 122 and 124 may be located along a high voltage diode area at the two bottom corners of the peripheral region 204. The peripheral region 204 laterally surrounds the circuit region 202 to form a guard ring for isolating the high voltage operations performed therein. According to an aspect of the present disclosure, one or more peripheral ESD protection structures (hereinafter the "peripheral structures") may be positioned within the peripheral region 204. According to another aspect of the present disclosure, the peripheral structures may serve as an ESD protection means for providing snapback protections from an ESD event. According to yet another aspect of the present disclosure, the peripheral structures may serve as an ESD protection means for conducting an ESD current away from one or more circuit components in the circuit region 202.

For example, the peripheral region 204 may include a first peripheral structure 222, a second peripheral structure 224, a third peripheral structure 232, and a fourth peripheral structure 234. The first and second peripheral structures 222 and 224 may have substantially the same structure, and they may each serve as a means for protecting a transistor (e.g., LDMOS transistors 122 and 124) within the circuit region 202. A cross-sectional view of the first peripheral structure 222 is shown in FIG. 3B to illustrate its structural arrangement with a high voltage transistor. Similarly, the third and fourth peripheral structures 232 and 234 may have substantially the same structure, and they may each serve as a means for protecting an avalanche diode within the circuit region 202. A cross-sectional view of the first peripheral structure 222 is shown in FIG. 3A to illustrate its structural arrangement with an avalanche diode.

To the extent that the first, second, third, and fourth peripheral structures 222, 224, 232, and 234 are substantially the same, these peripheral structures may extend contiguously within the peripheral region 204. As such, the peripheral structures 222, 224, 232, and 234 may form a contiguous ESD guard ring that laterally surrounds the circuit 202. Alternatively, the first, second, third, and fourth peripheral structures 222, 224, 232, and 234 may have different geometrical features from one another. In that case, the peripheral structures 222, 224, 232, and 234 may be segmented within the peripheral region 204. The segmented first, second, third, and fourth peripheral structures 222, 224, 232, and 234 may form a segmented ESD guard ring that laterally surrounds the circuit region 202

Figure 3A:
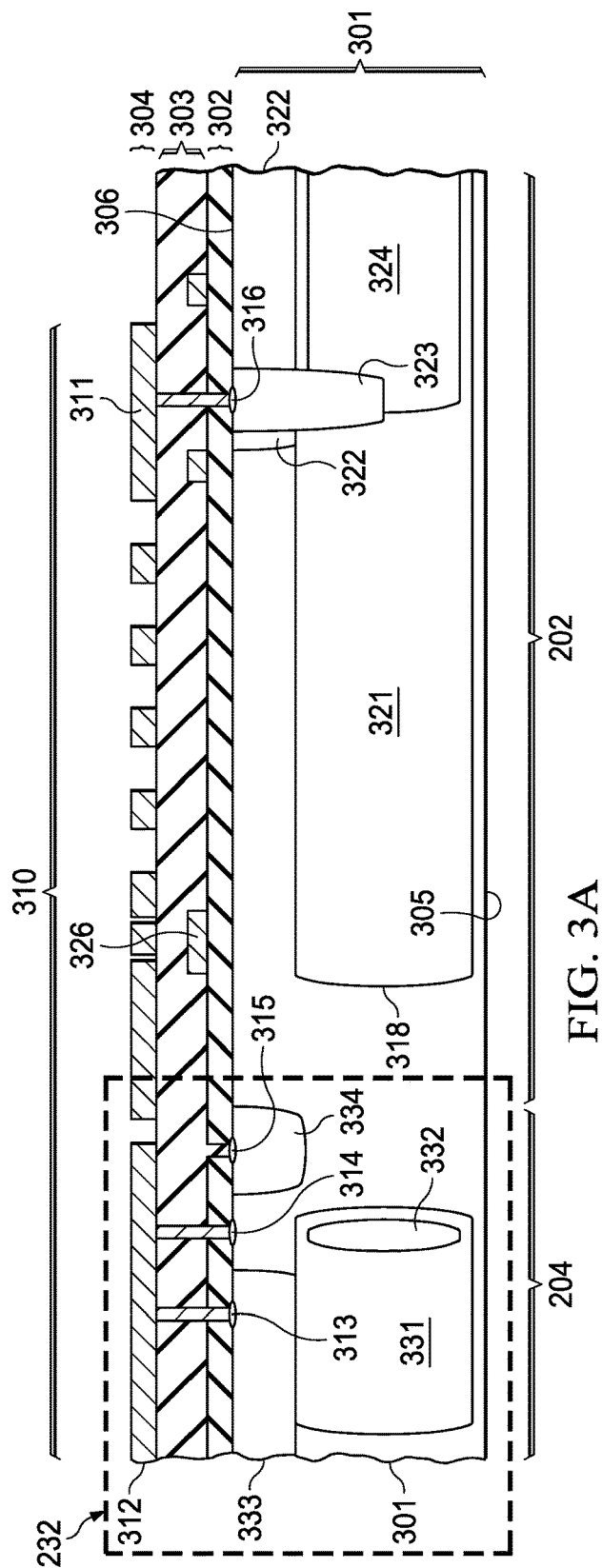
Figure 3B:
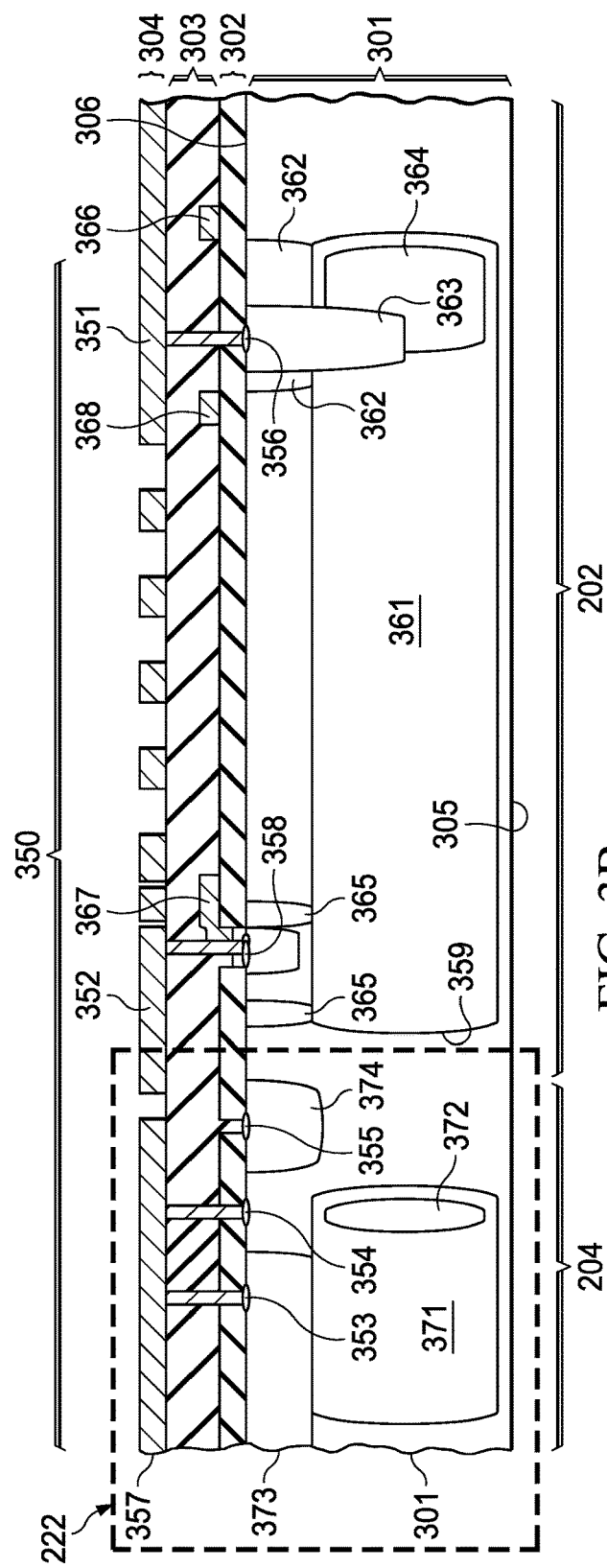

Referring to FIG. 3A, which shows a cross-sectional view of the driver integrated circuit 200, the peripheral structure 232 is configured to protect an avalanche diode 310. As a part of an integrated circuit die, the peripheral structure 232 and the avalanche diode 310 are formed on a semiconductor substrate 301. The semiconductor substrate 301 has a bottom surface 305 and a top surface 306 that faces away from the bottom surface 305. The semiconductor substrate 301 may be a single bulk substrate (e.g., single silicon crystalline substrate) or may include additional epitaxial layers developed thereon. The semiconductor substrate 301 may have a first conductive type. For example, the semiconductor substrate 301 may include a P-type carrier (e.g., Boron) and have a carrier concentration ranging from $5 \times 10^{13}$ $cm^{-3}$ to $5 \times 10^{14}$ $cm^{-3}$.

One or more buried doped layers (e.g., 321, and 324, 331, 332) may be developed under the top surface 306 of the semiconductor substrate 301. For instance, a buried doped layer (e.g., 321, and 324, 331, 332) may be developed 1 μm below the top surface 306. The buried doped layer (e.g., 321, and 324, 331, 332) can be developed by epitaxial growth or by deep ion implantation. In general, the buried doped layer (e.g., 321, and 324, 331, 332) has a second conductivity type that is the opposite of the first conductivity type. For instance, the buried doped layer (e.g., 321, and 324, 331, 332) includes an N-type dopant (e.g., Phosphorus, Arsenic and/or Antimony) where the semiconductor substrate 301 includes a P-type carrier (e.g., Boron). Conversely, the buried doped layer (e.g., 321, and 324, 331, 332) includes a P-type dopant where the semiconductor substrate 301 includes an N-type carrier. In either case, the buried doped layer (e.g., 321, and 324, 331, 332) and the semiconductor substrate 301 form one or more PN junctions. These PN junctions may experience avalanche breakdowns during an ESD event.

The driver integrated circuit 200 includes an avalanche diode 310 within the proximity of the peripheral structure 232. The avalanche diode 310 has a cathode region and an anode region. In general, the cathode region includes N-type dopants and the anode region includes P-type dopants. Positioned within the circuit region 202, the cathode region of the avalanche diode 310 includes an electrode 311, a contact region 316, a doped region 322, a heavily doped region 323, a doped buried layer 321, and a heavily doped buried layer 324. The electrode 311 is a cathode electrode formed as a part of an interconnect metal layer 304, which is positioned on a dielectric layer 303 and a field oxide layer 302. The contact region 316 is a cathode contact region that can be formed with an N-doped silicide layer connected to the electrode 311.

The doped region 322 is an N-doped region that extends from the contact region 316 to the buried layer 321 and the heavily doped buried layer 324. The heavily doped buried layer 324 has a higher doping concentration of N-type dopants than the buried layer 321. For instance, the heavily doped buried layer 324 may have a doping concentration ranges from $1 \times 10^{18}$ $cm^{-3}$ to $1 \times 10^{21}$ $cm^{-3}$, whereas the buried layer 321 may have a doping concentration ranges from $1 \times 10^{14}$ $cm^{-3}$ to $1 \times 10^{17}$ $cm^{-3}$. To enhance the breakdown characteristic of the avalanche diode 310, the buried layer 321 may serve as a lateral drift region of the heavily doped buried layer 324.

The heavily doped region 323 has a higher doping concentration of N-type dopants than the doped region 322 for reducing the resistance between the contact region 316 and the buried layers 321 and 324. For instance, the heavily doped region 323 may have a doping concentration ranges from $1 \times 10^{18}$ $cm^{-3}$ to $1 \times 10^{21}$ $cm^{-3}$, whereas the doped region 322 may have a doping concentration ranges from $1 \times 10^{14}$ $cm^{-3}$ to $1 \times 10^{17}$ $cm^{-3}$. The avalanche diode 310 may include a field plate 326 to shield the electric field of the buried layer 321 from the electric field of the interconnect metal layer 304.

The anode region of the avalanche diode 310 is positioned within the peripheral region 204 and partially extending to the circuit region 202. As such, a part of the anode region is interposed between a contact region 314 in the peripheral region 204 and the buried layer 321 in the circuit region 202. The anode region includes an electrode 312, a contact region 313, a doped region 333, and a portion of the substrate 301 that is interposed between the doped region 333 and the buried layer 321. The electrode 312 is an anode electrode formed as a part of the interconnect metal layer 304, which is positioned on a dielectric layer 303 and a field oxide layer 302. The contact region 313 is an anode contact region that can be formed with a P-doped silicide layer connected to the electrode 312.

The doped region 333 is a P-doped region that extends from the contact region 313 to a doped buried layer 331 and a heavily doped buried layer 332. The doped region 333 has a higher doping concentration of P-type dopants than the semiconductor substrate 301. For instance, the doped region 333 may have a doping concentration ranges from $1 \times 10^{15}$ $cm^{-3}$ to $1 \times 10^{21}$] $cm^{-3}$, whereas the semiconductor substrate 301 may have a doping concentration ranges from $5 \times 10^{13}$ $cm^{-3}$ to $5 \times 10^{14}$ $cm^{-3}$. Meanwhile, the heavily doped buried layer 332 has a higher doping concentration of N-type dopants than the buried layer 331. For instance, the heavily doped buried layer 332 may have a doping concentration ranges from $1 \times 10^{18}$ $cm^{-3}$ to $1 \times 10^{21}$ $cm^{-3}$, whereas the buried layer 331 may have a doping concentration ranges from $1 \times 10^{14}$ $cm^{-3}$ to $1 \times 10^{17}$ $cm^{-3}$. The buried layers 331 and 332 may serve as a means for directing the avalanche current of the avalanche diode 310 during an ESD event.

The peripheral structure 232 includes a first contact region 313, a second contact region 314, and a third contact region 315. The first contact region 313 is shared as the anode region of the avalanche diode 310 and as a base region of a bipolar transistor structure (see description of FIG. 3C below). The first contact region 313 and the second contact region 314 have opposite conductivity types. For instance the first contact region 313 can be formed with a P-doped silicide layer, whereas the second contact region 314 can be formed with an N-doped silicide layer. Serving as an emitter region of the bipolar transistor structure, the second contact region 314 is interposed between the first contact region 313 and the buried layer 321, which serves as a collector region of the bipolar transistor structure (see description of FIG. 3C below).

The first contact region 313 and the second contact region 314 are coupled to the electrode 312, which may be coupled to a ground voltage source for discharging an ESD current. The third contact region 315 is floating, and it can be formed with a P-doped silicide. Alternatively, the third contact region 315 may be coupled to the electrode 312 with a similar configuration as the first contact region 313. Each of the first, second, and third contact regions 313, 314, and 315 may form a contiguous ring along and within the peripheral region 204 to laterally surround the circuit region 202. Alternatively, each of the first, second, and third contact regions 313, 314, and 315 may be segmented along and within the peripheral region 204 to form a segmented ring that laterally surrounds the circuit region 202.

The peripheral structure 232 also includes a first doped region 333, a second dope region 334, a doped buried layer 331, a heavily doped buried layer 332. The first doped region 333 is shared as the anode region of the avalanche diode 310 and as the base region of the bipolar transistor structure (see description of FIG. 3C below). In general, the base region of the bipolar transistor structure extends from the first contact region 313 to a portion of the semiconductor substrate 301 that is interposed between the second contact region 314 and the buried layer 321, which is shared as the collector region and as the cathode region of the avalanche diode 310. The second doped region 334 includes P-type dopants and has a higher doping concentration than the semiconductor substrate 301. For instance, the second doped region 334 may have a doping concentration ranges from $1 \times 10^{15}$ cm$^{-3}$ to $1 \times 10^{21}$ cm$^{-3}$. The second doped region 334 is interposed between the second contact region 314 and the cathode region of the avalanche diode 310. The second doped region 334, alongside with the buried layers 331 and 332, help guide the avalanche current from the buried layer 321 to the first and second contact regions 313 and 314. By diverting the avalanche current from the buried layer 321 and the PN junction 318, the peripheral structure 232 facilitates a robust snapback response during an ESD event.

For instance, the electrode 311 is configured to receive an ESD voltage (e.g., 1 kV or greater) during an ESD event. The doped region 322 is configured to establish a discharge path between the electrode 311 and the buried layers 321 and 324. When the buried layer 321 incurs a substantial potential build-up (e.g., 700V or greater), the PN junction 318 may experience an avalanche breakdown. To alleviate the potential at the PN junction 318, the peripheral structure 232 provides a snapback mechanism, which direct the avalanche current to flow through the first and second contact regions 313 and 314. Because the electrode 312 is configured to receive a ground supply voltage, which is substantially lower than the potential build-up at the PN junction 318, the second electrode 312 extends the discharge path away from the circuit region 202 via the first and second contact regions 313 and 314. Advantageously, the peripheral structure 232 protects the buried layer 321 from incurring a very high voltage (e.g., more than 1 kV) while discharging a current with very high current density (e.g., about 1 μA/μm).

Referring to FIG. 3B, which shows a cross-sectional view of the driver integrated circuit 200, the peripheral structure 222 is configured to protect a lateral drain metal oxide semiconductor (LDMOS) transistor 350. The LDMOS transistor 350 can be used for implementing either one of the LDMOS transistors 122 and 124 as shown and described in FIG. 1. As a part of an integrated circuit die, the peripheral structure 222 and the LDMOS transistor 350 are formed on the semiconductor substrate 301. One or more buried doped layers (e.g., 361, and 364, 371, 372) may be developed under the top surface 306 of the semiconductor substrate 301. For instance, a buried doped layer (e.g., 361, and 364, 371, 372) may be developed 1 μm below the top surface 306.

In general, the buried doped layer (e.g., 361, and 364, 371, 372) has a second conductivity type that is the opposite of the first conductivity type. For instance, the buried doped layer (e.g., 361, and 364, 371, 372) includes an N-type dopant (e.g., Phosphorous, Arsenic, and/or Antimony) where the semiconductor substrate 301 includes a P-type dopant (e.g., Boron). Conversely, the buried doped layer (e.g., 361, and 364, 371, 372) includes a P-type dopant where the semiconductor substrate 301 includes an N-type dopant. As such, the buried doped layer (e.g., 361, and 364, 371, 372) and the semiconductor substrate 301 create one or more PN junctions that may experience avalanche breakdowns during an ESD event. The buried doped layer (e.g., 361, and 364, 371, 372) can be developed by epitaxial growth or by deep ion implantation. For efficiency, the buried doped layer (e.g., 361, and 364, 371, 372) may be formed with the same process steps as the buried doped layer (e.g., 361, and 364, 371, 372) as shown and described in FIG. 3A.

The LDMOS transistor 350 is positioned within the circuit region 202 and adjacent to the peripheral structure 222. The LDMOS transistor 350 has a drain region, a lateral drain region, a source region, and a body region. In general, the drain region, lateral drain region, and source region include N-type dopants and the body region includes P-type dopants. Positioned within the circuit region 202, the drain region of the LDMOS transistor 350 includes an electrode 351, a contact region 356, a doped region 362, and optionally a heavily doped region 363. The lateral drain region includes a doped buried layer 361, optionally a heavily doped buried layer 364, and a doped region 365. The electrode 351 is a drain electrode formed as a part of the interconnect metal layer 304, which is positioned on the dielectric layer 303 and the field oxide layer 302. The contact region 356 is a drain contact region that can be formed with an N-doped silicide layer connected to the electrode 351.

The doped region 362 is an N-doped region that extends from the contact region 356 to the buried layer 361 and the heavily doped buried layer 364. The heavily doped buried layer 364 has a higher doping concentration of N-type dopants than the buried layer 361. For instance, the heavily doped buried layer 364 may have a doping concentration ranges from $1 \times 10^{18}$ cm$^{-3}$ to $1 \times 10^{21}$ cm$^{-3}$, whereas the buried layer 361 may have a doping concentration ranges from $1 \times 10^{14}$ cm$^{-3}$ to $1 \times 10^{17}$ cm$^{-3}$. To enhance the breakdown characteristic of the LDMOS transistor 350, the buried layer 361 may serve as a lateral drain drift region of the heavily doped buried layer 364.

The heavily doped region 363 has a higher doping concentration of N-type dopants than the doped region 362 for reducing the resistance between the contact region 356 and the buried layers 361 and 364. For instance, the heavily doped region 363 may have a doping concentration ranges from $1 \times 10^{18}$ cm$^{-3}$ to $1 \times 10^{21}$ cm$^{-3}$, whereas the doped region 362 may have a doping concentration ranges from $1 \times 10^{14}$ cm$^{-3}$ to $1 \times 10^{17}$ cm$^{-3}$. The LDMOS transistor 350 may include field plates 366 and 368 to shield the electric field of the drain region and lateral drain region from the electric field of the interconnect metal layer 304.

Positioned between the peripheral structure 222 and the drain contact region 356, the source region of the LDMOS transistor 350 includes an electrode 352 and a contact region 358. The electrode 352 is a source electrode formed as a part of the interconnect metal layer 304. The contact region 358 is a source contact region that can be formed with an N-doped silicide layer connected to the electrode 352. The source contact region 358 is laterally surrounded by the doped region 365, which is extended from the buried layer 361 positioned thereunder. The LDMOS transistor 350 also includes a gate electrode 367 that is positioned above the top surface 306 and across a channel region between the source contact region 358 and the doped region 365. When the gate electrode 367 carries a voltage sufficient to deplete the channel region, the source contact region 358 will conduct a current from the buried layer 361 to the source electrode 352, which can be connected to a ground voltage source.

During an ESD event, the source electrode 352 may discharge all or a portion of the ESD current. When a substantial amount of the ESD current is not discharged by the source electrode 352, the potential of the buried layer 361 will begin to build up. At a certain threshold, the potential of the buried layer 361 is high enough to initiate an avalanche breakdown at a PN junction 359, which leads to the generation of an avalanche current. The peripheral structure 222 provides a mechanism to divert the avalanche current while preventing the potential of the buried layer 361 from exceeding a safe area of operation.

Similar to the peripheral structure 232, the peripheral structure 222 includes a first contact region 353, a second contact region 354, and a third contact region 355. The first contact region 353 serves as a base region of a bipolar transistor structure, whereas the second contact region 354 serves as an emitter region of the bipolar transistor structure (see description of FIG. 3C below). The first contact region 353 and the second contact region 354 have opposite conductivity types. For instance the first contact region 353 can be formed with a P-doped silicide layer, whereas the second contact region 354 can be formed with an N-doped silicide layer. Serving as the emitter region of the bipolar transistor structure, the second contact region 354 is interposed between the first contact region 353 and the buried layer 361, which serves as a collector region of the bipolar transistor structure (see description of FIG. 3C below) in addition to serving as a lateral drain drift region of the LDMOS transistor 350.

The first contact region 353 and the second contact region 354 are coupled to the electrode 357, which may be coupled to a ground voltage source for discharging an ESD current. The third contact region 355 is floating, and it can be formed with a P-doped silicide. Alternatively, the third contact region 355 may be coupled to the electrode 357 with a similar configuration as the first contact region 353. Each of the first, second, and third contact regions 353, 354, and 355 may form a contiguous ring along and within the peripheral region 204 to laterally surround the circuit region 202.

In one implementation, for example, the first contact region 333 of the peripheral structure 232 and the first contact region 353 of the peripheral structure 222 can be connected to each other to form a first contiguous ring. In another implementation, for example, the second contact region 334 of the peripheral structure 232 and the second contact region 354 of the peripheral structure 222 can be connected to each other to form a second contiguous ring. In yet another implementation, for example, the third contact region 335 of the peripheral structure 232 and the third contact region 355 of the peripheral structure 222 can be connected to each other to form a third contiguous ring. Alternatively, each of the first, second, and third contact regions 353, 354, and 355 may be segmented along and within the peripheral region 204 to form a segmented ring that laterally surrounds the circuit region 202.

The peripheral structure 222 also includes a first doped region 373, a second dope region 374, a doped buried layer 371, and a heavily doped buried layer 372. The first doped region 373 serves as the base region of the bipolar transistor structure (see description of FIG. 3C below). The first and second doped regions 373 and 374 each includes a P-type dopant and has a higher doping concentration than the semiconductor substrate 301. For instance, the first and second doped regions 373 and 374 each may have a doping concentration ranges from $1\times10^{15}$ cm$^{-3}$ to $1\times10^{21}$ cm$^{-3}$.

In general, the base region of the bipolar transistor structure extends from the first contact region 353 to a portion of the semiconductor substrate 301 that is interposed between the second contact region 354 and the buried layer 361. The second doped region 374 is interposed between the second contact region 354 and buried layer 361 (i.e., the lateral drain drift region 361 of the LDMOS transistor 350). The second doped region 374, alongside with the buried layers 371 and 372, help guide the avalanche current from the buried layer 361 to the first and second contact regions 353 and 354. By diverting the avalanche current from the buried layer 361 and the PN junction 359, the peripheral structure 222 facilitates a robust snapback response during an ESD event.

For instance, the electrode 351 is configured to receive an ESD voltage (e.g., 1 kV or greater) during an ESD event. The doped region 362 is configured to establish a discharge path between the electrode 351 and the buried layers 361 and 364. When the buried layer 361 incurs a substantial potential build-up (e.g., 700V or greater), the PN junction 359 may experience an avalanche breakdown. To alleviate the potential at the PN junction 359, the peripheral structure 222 provides a snapback mechanism, which direct the avalanche current to flow through the first and second contact regions 353 and 354. Because the electrode 357 is configured to receive a ground supply voltage, which is substantially lower than the potential build-up at the PN junction 359, the second electrode 357 extends the discharge path away from the circuit region 202 via the first and second contact regions 353 and 354. Advantageously, the peripheral structure 222 protects the buried layer 361 from incurring a very high voltage (e.g., more than 1 kV) while discharging a current with very high current density (e.g., about 1 µA/µm).

FIG. 3C show a cross-sectional view of a peripheral structure 340 to illustrate the snapback mechanism as discussed in FIGS. 3A and 3B. Similar to the peripheral structures 222 and 232, the peripheral structure 340 includes a P+ contact region 343, an N+ contact region 344, a first P-doped region 383, a second P-doped region 386, an N-doped buried layer 381, and an N+ buried layer 382. Theses structural components of the peripheral structure 340 help define a bipolar transistor structure 390 for providing snapback protection to the circuit region 202 during an ESD event. The bipolar transistor structure 390 partially resides within the peripheral region 204 to form an ESD guard ring that circumscribes the circuit region 204.

The bipolar transistor structure 390 includes a collector region 391, a base region 392, and an emitter region 393. The emitter region 393 includes the N+ contact region 344. The collector region 391 includes a buried layer within the circuit region 202, such as the buried layer 361 (i.e., the lateral drain drift region of the LDMOS transistor 350) or the buried layer 321 (i.e., the cathode region of the avalanche diode 310). The base region 392 includes the first contact region 343, the first doped region 383, a pinch resistance region 385, and a part of the substrate 301 that is interposed between the N+ contact region 344 and the cathode region 391.

The pinch resistance region 385 includes a P-type dopant, and it is positioned under the second contact region 344 and between the first and second doped regions 343 and 344. Moreover, the pinch resistance region 385 has pinch resistance $R_P$ that is proportional to a length $L_P$ of the pinch resistance region 385 and inversely proportional to a width $W_P$ of the pinch resistance region 385. The length $L_P$ is defined by a distance between the P+ contact region 343 and the N+ contact region 344. The width $W_P$ is defined be a distance between the N+ contact region 344 and the buried layers 381 and 382.

During an ESD event, the collector region 391 may experience a potential build-up. When the PN junction between the collector region 391 and the base region 392 exceeds a PN-junction breakdown voltage (e.g., greater than 700V), electron-hole pairs are created to generate an avalanche current $I_{AV}$. Initially, the avalanche current $I_{AV}$ flows toward the P+ contact region 343 to reach the ground voltage source via the ground electrode 342. Because of the pinch resistance $R_P$, the potential of the pinch resistance region 385 near the emitter region 393 begins to rise as the amount of the avalanche current $I_{AV}$ increases. When the potential of the pinch resistance region 385 is sufficiently high to create a forward bias with the N+ contact region 344, the avalanche current $I_{AV}$ will flow from the base region 392 to the emitter region 393. By diverting the avalanche current $J_{AV}$ from the collector region 391 (i.e., the buried layers 321 and/or 361), the bipolar transistor structure 390 reduces the potential of the collector region 391 even when an increasing amount of ESD current is flowing through the collector region 391. To that end, the bipolar transistor structure 390 provides a snapback protection to the circuit region 202. Advantageously, the circuit region 202 may operate within a safe operation area (SOA) while meeting a certain HBM ESD standard (e.g., 1 kV to 2 kV).

For a robust snapback response, the pinch resistance $R_P$ can be set at a relatively large value, such that a small amount avalanche current $I_{AV}$ may cause the potential of the pinch resistance region 385 to rise substantially and quickly. In one implementation, for example, the pinch resistance $R_P$ may be configured by having the length $L_P$ and the width $W_P$ at a ratio that is equal to or greater than 8. In another implementation, for example, the pinch resistance $R_P$ may be configured by having the length $L_P$ and the width $W_P$ at a ratio that is equal to or greater than 20.

Referring to FIG. 4, several current-voltage (IV) curves are shown to demonstrate the effects of snapback protections. A first IV curve 410 illustrates the current-voltage characteristics of a first ESD device with no snapback response. With no snapback response, the buried layer voltage $V_{BL}$ of the first device continues to rise with an increasing amount of avalanche current $I_{AV}$ density, thereby bringing the first device outside of the safe operation area SOA.

A second IV curve 420 illustrates the current-voltage characteristics of a second ESD device with a slow snapback response. With the slow snapback response, the buried layer voltage $V_{BL}$ of the second ESD device continues to rise with an increasing amount of avalanche current $I_{AV}$ density until the avalanche current $I_{AV}$ density reaches 1.0 µA/µm. And at that point, the buried layer voltage $V_{BL}$ of the second ESD device begins to drop, thereby keeping the second ESD device within the safe operation area SOA.

A third IV curve 430 illustrates the current-voltage characteristics of a third ESD device with a fast snapback response. With the fast snapback response, the buried layer voltage $V_{BL}$ of the third ESD device begins to drop as soon as the amount of avalanche current $I_{AV}$ density reaches 0.17 µA/µm. Advantageously, the third ESD device is kept within the safe operation area SOA starting from an early stage of an ESD event.

Figure 5B:
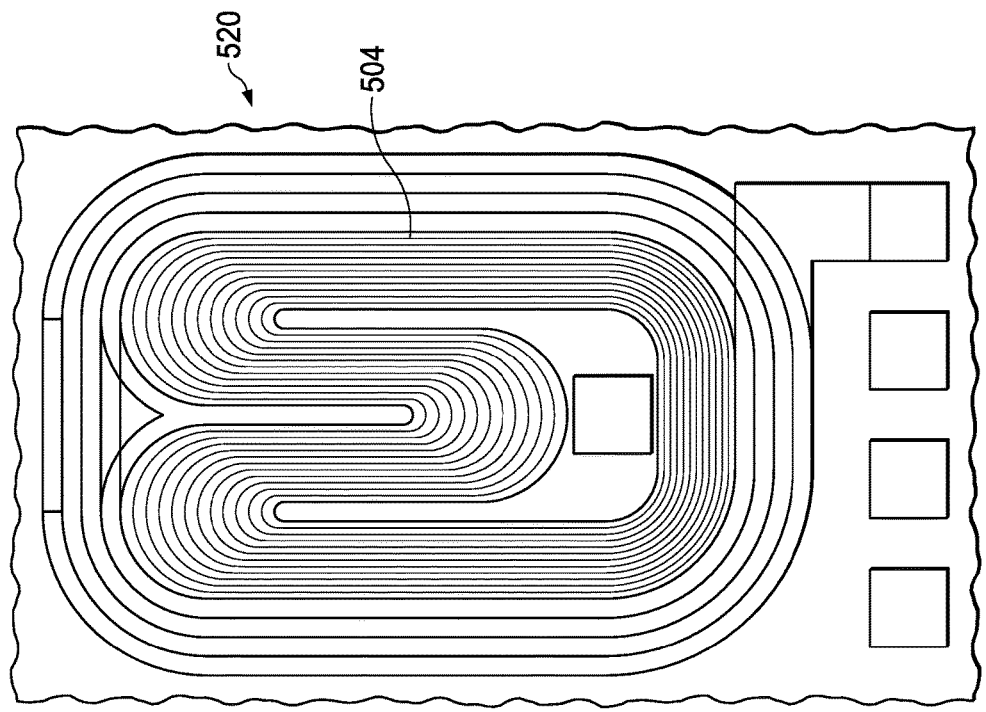
FIG. 5B shows a top exposed view of another electrostatic discharge (ESD) device according to another aspect of the present disclosure.
Figure 5A:
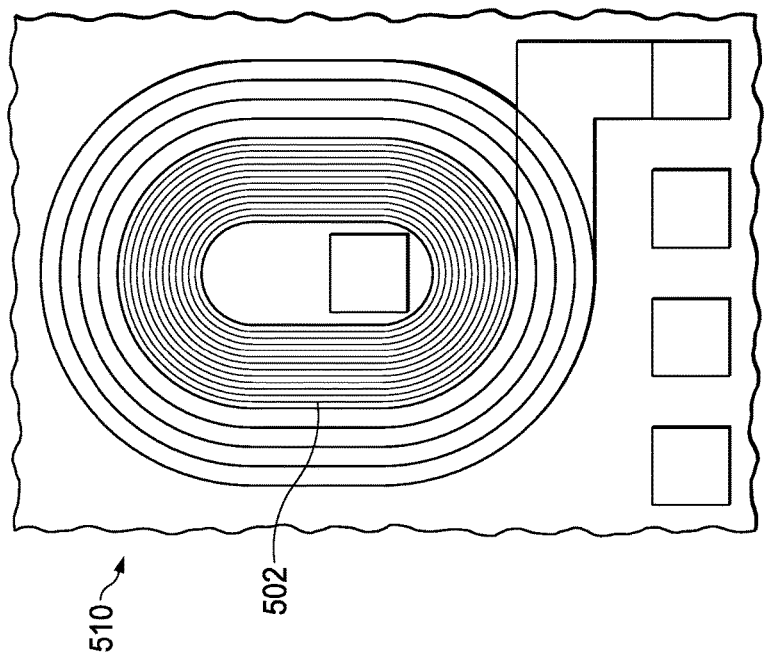
FIG. 5A shows a top exposed view of an electrostatic discharge (ESD) device according to an aspect of the present disclosure.

The disclosed ESD protection structures (e.g., the peripheral structures 222, 224, 232, 234, and 340) can be applied to protect a wide range of high voltage (e.g., operation voltage that is greater than 700V) circuitries and circuit components aside from the driver integrated circuits 100 and 200. The disclosed ESD protection structures may also adopt various peripheral shapes and configurations. As shown in FIG. 5A, in one example, an ESD guard ring 502 having a race track profile can be used for protecting a high voltage device 510. And as shown in FIG. 5B, in another example, an ESD guard ring 504 having a multi-finger profile can be used for protecting a high voltage device 520.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application Consistent with the present disclosure, the terms "about," "approximately," "substantially the same," "substantially equal to" and "substantially equal" as applied to features of an integrated circuit is understood to mean equal within fabrication tolerances used to form the integrated circuit or to perform one or more functions by the integrated circuit. More specifically, the terms "about," "approximately," "substantially the same," "substantially equal to" and "substantially equal" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit, comprising:
   a semiconductor substrate having a first conductivity type and a top surface defining a circuit region and a peripheral region laterally surrounding the circuit region;
   a buried layer under the top surface and positioned within the circuit region and adjacent to the peripheral region, the buried layer having a second conductivity type opposite to the first conductivity type; and
   a peripheral structure positioned within the peripheral region and adjacent to the top surface, the peripheral structure including a first contact region having the first conductivity type, and a second contact region having the second conductivity type, the second contact region interposed between the buried layer and the first contact region,.
   wherein the peripheral structure includes a doped region having the first conductivity type and a higher doping concentration than the semiconductor substrate, the doped region interposed between the second contact region and the buried layer.

2. The integrated circuit of claim 1, further comprising:
   a bipolar transistor structure having:
     a collector region in the buried layer;
     a base region extending from the first contact region to a portion of the semiconductor substrate interposed between the second contact region and the buried layer; and
     an emitter region in the second contact region.

3. The integrated circuit of claim 1, wherein each of the first and second contact regions extends contiguously within the peripheral region and laterally surrounds the circuit region.

4. The integrated circuit of claim 1, wherein each of the first and second contact regions is segmented within the peripheral region and laterally surrounds the circuit region.

5. The integrated circuit of claim 1, wherein the peripheral structure includes:
   a second buried layer having the second conductivity type, the second buried layer extending under the first contact region and the second contact region; and
   a doped region having the first conductivity type and a higher doping concentration than the semiconductor substrate, the doped region extending from the first contact region to the second buried layer.

6. The integrated circuit of claim 1, further comprising:
   a lateral drain metal oxide semiconductor (LDMOS) transistor within the circuit region, the LDMOS transistor having:
     a drain contact region adjacent to the top surface;
     a first doped region having the second conductivity type and extending from the drain contact region to the buried layer;
     a source contact region positioned between the peripheral structure and the drain contact region; and
     a second doped region having the second conductivity type and extending from the buried layer to the top surface adjacent to the source contact region.

7. The integrated circuit of claim 1, further comprising:
   a diode having:
     a cathode contact region within the circuit region and adjacent to the top surface;
     a doped region having the second conductivity type and extending from the cathode contact region to the buried layer; and
     an anode region extending from the first contact region to a portion of the semiconductor substrate interposed between the second contact region and the buried layer.

8. The integrated circuit of claim 1, further comprising:
   a first electrode configured to receive a voltage above 1 kV;
   a doped region having the second conductivity type and establishing a discharge path between the first electrode and the buried layer; and
   a second electrode configured to receive a ground supply voltage, and the second electrode coupled to the first contact region and the second contact region to extend the discharge path.

9. The integrated circuit of claim 1, wherein the first conductivity type is P-type and the second conductivity type is N-type.

10. An integrated circuit, comprising:
a semiconductor substrate having a P-type dopant and a top surface defining a circuit region and a peripheral region laterally surrounding the circuit region;
a diode having a cathode region positioned within the circuit region and adjacent to the peripheral region, the cathode region having an N-type dopant;
a lateral drain metal oxide semiconductor (LDMOS) transistor positioned within the circuit region and adjacent to the peripheral region, the LDMOS transistor having a lateral drain region separated from the cathode region, and the lateral drain region having the N-type dopant; and
a peripheral structure positioned within the peripheral region and adjacent to the top surface, the peripheral structure including a first contact region having the P-type dopant, and a second contact region having the N-type dopant, the second contact region interposed between the first contact region and the cathode region, and interposed between the first contact region and the lateral drain region,
wherein the peripheral structure includes a doped region having the P-type dopant and a higher doping concentration than the semiconductor substrate, the doped region interposed between the second contact region and the cathode region of the diode, and interposed between the second contact region and the LDMOS transistor.

11. The integrated circuit of claim 10, further comprising:
a bipolar transistor structure having:
a collector region in the cathode region;
a base region extending from the first contact region to a portion of the semiconductor substrate interposed between the second contact region and the cathode region; and
an emitter region in the second contact region.

12. The integrated circuit of claim 10, further comprising:
a bipolar transistor structure having:
a collector region in the lateral drain region;
a base region extending from the first contact region to a portion of the semiconductor substrate interposed between the second contact region and the lateral drain region; and
an emitter region in the second contact region.

13. The integrated circuit of claim 10, wherein each of the first and second contact regions extends contiguously within the peripheral region and laterally surrounds the circuit region.

14. The integrated circuit of claim 10, wherein each of the first and second contact regions is segmented within the peripheral region based on a distribution of the diode and the LDMOS transistor.

15. The integrated circuit of claim 10, wherein the peripheral structure includes:
a buried layer having the N-type dopant, the buried layer extending under the first contact region and the second contact region; and
a doped region having the P-type dopant and a higher doping concentration than the semiconductor substrate, the doped region extending from the first contact region to the buried layer.

16. The integrated circuit of claim 10, wherein the LDMOS transistor includes:
a drain contact region adjacent to the top surface;
a first doped region having the N-type dopant and extending from the drain contact region to the lateral drain region;
a source contact region positioned between the peripheral structure and the drain contact region; and
a second doped region having the N-type dopant and extending from the lateral drain region to the top surface adjacent to the source contact region.

17. The integrated circuit of claim 10, wherein the diode includes:
a cathode contact region within the circuit region and adjacent to the top surface;
a doped region having the N-type dopant and extending from the cathode contact region to the cathode region; and
an anode region extending from the first contact region to a portion of the semiconductor substrate interposed between the second contact region and the cathode region.

18. The integrated circuit of claim 10, further comprising:
a first electrode configured to receive a voltage above 1 kV;
a first doped region having the N-type dopant and establishing a first discharge path between the first electrode and the cathode region;
a second doped region having the N-type dopant and establishing a second discharge path between the first electrode and the lateral drain region; and
a second electrode configured to receive a ground supply voltage, and the second electrode coupled to the first contact region and the second contact region to extend the first and second discharge paths.

* * * * *